(12) United States Patent
Mitchell et al.

(10) Patent No.: US 10,157,763 B2
(45) Date of Patent: Dec. 18, 2018

(54) HIGH THROUGHPUT SUBSTRATE HANDLING ENDSTATION AND SEQUENCE

(71) Applicant: Varian Semiconductor Equipment Associates, Inc., Gloucester, MA (US)

(72) Inventors: Robert J. Mitchell, Winchester, MA (US); Eric Hermanson, Georgetown, MA (US); Benjamin B. Riordon, Newburyport, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 804 days.

(21) Appl. No.: 14/013,693

(22) Filed: Aug. 29, 2013

(65) Prior Publication Data

US 2015/0063954 A1 Mar. 5, 2015

(51) Int. Cl.
*B65G 29/00* (2006.01)
*H01L 21/677* (2006.01)

(52) U.S. Cl.
CPC .. *H01L 21/67745* (2013.01); *H01L 21/67742* (2013.01); *Y10S 901/02* (2013.01)

(58) Field of Classification Search
CPC ...................................................... B65G 29/00
See application file for complete search history.

(56) References Cited

U.S. PATENT DOCUMENTS

| 5,486,080 A | 1/1996 | Sieradzki |
| 7,949,425 B2 | 5/2011 | Mitchell et al. |
| 8,731,706 B2* | 5/2014 | Kimura ............. H01L 21/67745 414/225.01 |
| 2003/0123958 A1* | 7/2003 | Sieradzki .......... H01L 21/67778 414/217 |

* cited by examiner

*Primary Examiner* — Saul Rodriguez
*Assistant Examiner* — Willie Berry, Jr.

(57) ABSTRACT

Systems and methods for facilitating expeditious handling and processing of semiconductor substrates with a minimal number of handling devices. Such a system may include an entry load-lock configured to transfer substrates from an atmospheric environment to a vacuum chamber, an alignment station disposed in the vacuum chamber and configured to adjust orientations of substrates, a first vacuum robot configured to move substrates from the entry load-lock to the alignment station, a process station disposed in the vacuum chamber and configured to perform a designated process on substrates, first and second exit load-locks configured to transfer substrates from the vacuum chamber to the atmospheric environment, and a second vacuum robot configured to move substrates from the alignment station to the process station and further configured to move substrates from the process station to the first exit load-lock and to the second exit load-lock in an alternating fashion.

10 Claims, 7 Drawing Sheets

HIGH THROUGHPUT SUBSTRATE HANDLING ENDSTATION AND SEQUENCE

FIELD OF THE DISCLOSURE

The disclosure relates generally to the field of semiconductor device fabrication, and more particularly to a processing system and method for facilitating expeditious handling and high throughput of semiconductor substrates.

BACKGROUND OF THE DISCLOSURE

During the processing of silicon substrates in the manufacture of microelectronic circuits, many different tools may be employed for performing processes on the substrates. Various handling devices, such as robotic arms, may also be employed for moving the substrates between stations at which processing steps are performed. Each movement between stations entails a corresponding handling time required for performing the movement.

Generally, the various processes performed on a substrate must be executed in a particular, sequential order, and thus a process cannot be commenced on a substrate until a preceding process has been completed and the substrate has been delivered to a new process station. It is therefore generally desirable to reduce the handling time between successive stations in order to maximize the throughput of substrates while providing sufficient time for the execution of each process step. One way to reduce handling time is to reduce the number of movements (e.g., picks and places) that each handling device is responsible for performing. However, it is also generally desirable to minimize the number of handling devices that are involved in a process stream in order to reduce cost and complexity within a manufacturing environment. The layout, configuration, and sequencing of a substrate processing system are therefore important in order to optimize the throughput of substrates.

SUMMARY

In view of the foregoing, it would be advantageous to provide a substrate processing system and method that facilitate handling of semiconductor substrates to maximize throughput while providing more time to perform processes on the substrates. It would further be advantageous to provide such a system and method that employ a minimal number of handling devices.

An exemplary system in accordance with the present disclosure may include an entry load-lock configured to transfer substrates from an atmospheric environment to a vacuum chamber, an alignment station disposed in the vacuum chamber and configured to adjust orientations of substrates, a first vacuum robot configured to move substrates from the entry load-lock to the alignment station, a process station disposed in the vacuum chamber and configured to perform a designated process on substrates, first and second exit load-locks configured to transfer substrates from the vacuum chamber to the atmospheric environment, and a second vacuum robot configured to move substrates from the alignment station to the process station and further configured to move substrates from the process station to the first exit load-lock and to the second exit load-lock in an alternating fashion.

An alternative system in accordance with the present disclosure may include an entry load-lock configured to transfer substrates from an atmospheric environment to a vacuum chamber, an alignment station disposed in the vacuum chamber and configured to adjust orientations of substrates, a first vacuum robot configured to move substrates from the entry load-lock to the alignment station, a process station disposed in the vacuum chamber and configured to perform a designated process on substrates, a buffer station configured to hold a plurality of substrates, an exit load-lock configured to transfer a plurality of substrates from the vacuum chamber to the atmospheric environment, and a second vacuum robot configured to sequentially move substrates from the alignment station to the process station and from the process station to the buffer station, and further configured to move an accumulated plurality of substrates from the buffer station to the exit load-lock.

An exemplary method in accordance with the present disclosure may include the steps of moving a first substrate from an entry load-lock to an alignment station, moving the first substrate from the alignment station to a process station and moving a second substrate from the entry load-lock to the alignment station, moving the first substrate from the process station to a first exit load-lock and moving the second substrate from the alignment station to the process station, closing the first exit load-lock to a vacuum chamber and opening the first exit load-lock to an atmospheric environment and moving the second substrate from the alignment station a second exit load-lock, and closing the first exit load-lock to the atmospheric environment and opening the first exit load-lock to the vacuum chamber and closing the second exit load-lock to the vacuum chamber and opening the second exit load-lock to the atmospheric environment.

An alternative method in accordance with the present disclosure may include the steps of moving a substrate from an entry load-lock to an alignment station, moving the substrate from the alignment station to a process station, moving the substrate from the process station to a buffer station, accumulating a predetermined number of substrates at the buffer station, and simultaneously moving all of the accumulated substrates from the buffer station to an exit load-lock.

DETAILED DESCRIPTION

Figure 1:
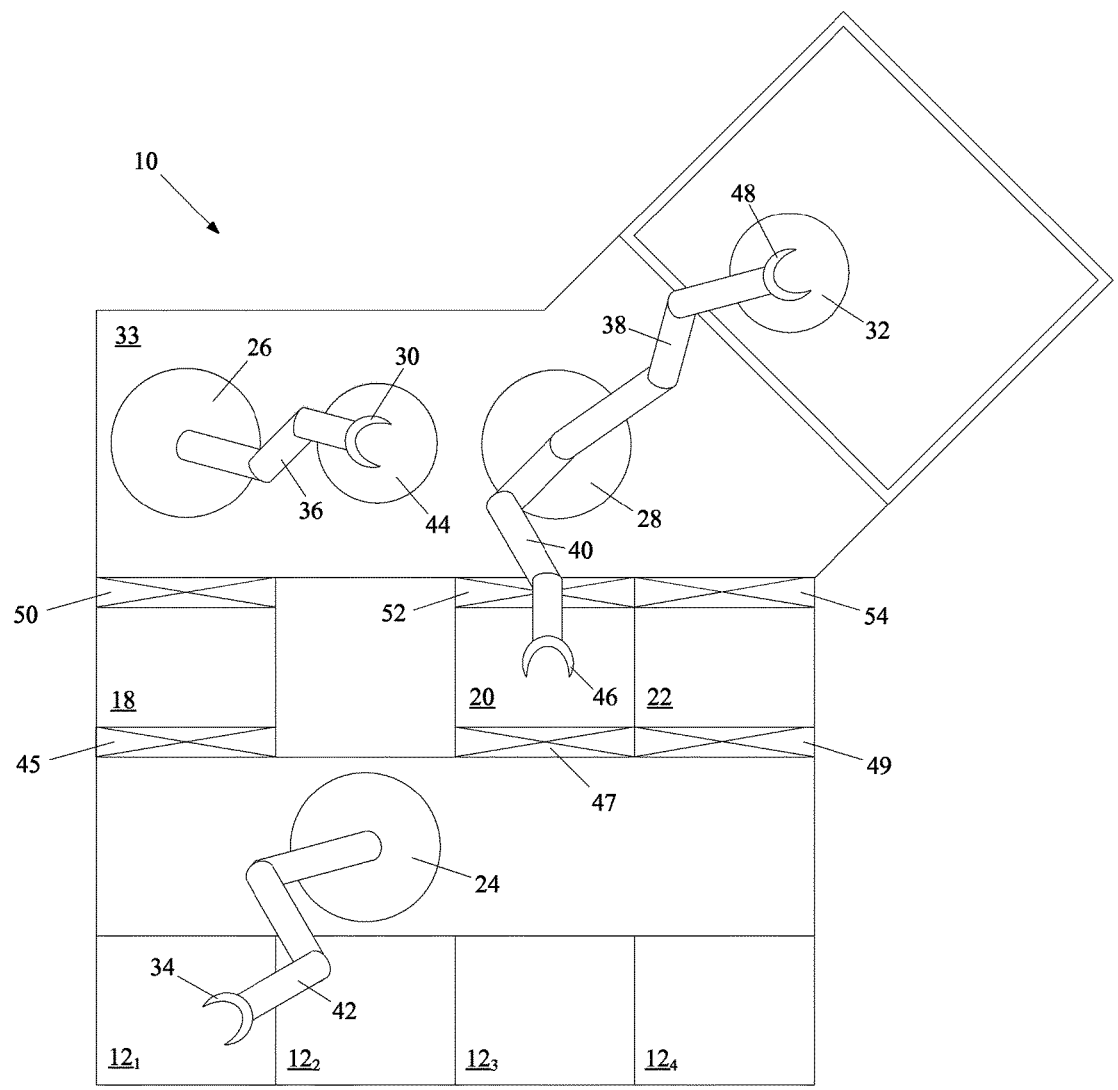
FIG. 1 is a schematic diagram illustrating an exemplary substrate processing system in accordance with the present disclosure.

Systems and methods in accordance with the present disclosure will now be described more fully hereinafter with reference to the accompanying drawings, in which preferred embodiments of the device are shown. The disclosed systems and methods, however, may be embodied in many different forms and should not be construed as being limited to the embodiments set forth herein. Rather, these embodiments are provided so that this disclosure will be thorough and complete, and will fully convey the scope of the device to those skilled in the art. In the drawings, like numbers refer to like elements throughout.

Referring to FIG. 1, a substrate processing system 10 (hereinafter "the system 10") in accordance with the present disclosure is shown. The system 10 is provided for optimizing throughput of substrates for high speed processing in nearly a continuous flow while employing a minimal number of handling devices.

The system 10 may include one or more carriers $12_{1-n}$, (shown as carriers $12_{1-4}$ in the non-limiting illustrated embodiment), an entry load-lock 18, first and second exit load-locks 20 and 22, an atmospheric robot 24, first and second vacuum robots 26 and 28, an alignment station 30, and a process station 32. The vacuum robots 26 and 28, the alignment station 30, and the process station 32 may be located in a vacuum chamber 33, and the load-locks 18-22 may be configured to facilitate the transfer of substrates (e.g., silicon wafers) into and out of the vacuum chamber 33 in a manner that will be familiar to those of ordinary skill in the art. The robots 24-28 may be configured to convey substrates between the carriers $12_{1-n}$, the load-locks 18-22, and the alignment and process stations 30 and 32 as further described below.

The robots 24-28 are shown in the figures as having multi-segmented, articulated arms. Particularly, the atmospheric robot 24 and the vacuum robot 26 are shown as having respective arms 34 and 36, and the vacuum robot 28 is shown as having first and second independent arms 38 and 40. Of course, it is contemplated that the vacuum robot 28 could be replaced by two separate robots having one arm each. It is further contemplated that, instead of having articulated arms, one or more of the robots 24-28 may alternatively include any of a variety of conveyance mechanisms configured to convey substrates along a series of substantially linear paths. Such mechanisms will be familiar to those of ordinary skill in the art and may be implemented in the system 10 as long as they can efficiently convey substrates in the manner described below.

The atmospheric robot 24 may actively grip substrates, such as with a vacuum grip or edge clamping, thereby allowing the atmospheric robot 24 to securely hold a substrate while making high acceleration movements. Conversely, the first and second vacuum robots 26 and 28 generally do not actively grip substrates during conveyance thereof, but instead employ respective end effectors 44, 46, and 48 that may be slid underneath a lower surface of a substrate after the substrate has been raised to an accessible position, such as by lift pins or the like. The end effectors 44-48 may be provided with friction pads on their upwardly facing surfaces for engaging substrates therewith, wherein the friction pads have sufficiently high coefficients of friction to prevent substrates from sliding off of the end effectors 44-48 when being moved.

After engaging a substrate, each robot 24-28 may execute a respective series of conveyance movements as further described below. Such conveyance movements may include a combination of one or more linear and/or rotational motions which are performed in a predefined (e.g., preprogrammed) sequence for moving a substrate from a first position to a next desired position. Embodiments of the system 10 are contemplated in which one or more of the end effectors 42-48 may include claws, pincers, articulated fingers, clamps, etc. for gripping a substrate in order to effectuate movement thereof.

The alignment station 30 of the system 10 may include an alignment turntable, configured to orient substrates in a desired manner prior to processing. For example, the alignment station 30 may detect a notch or other indicia on a substrate to determine and/or adjust the orientation thereof. If substrate alignment is not required, the alignment station 30 may include a simple pedestal or stand. The alignment station 30 may be also be configured to perform additional functions such as substrate identification.

The process station 32 may include a flat platen or stage having suitable registration, clamping, and cooling mechanisms for receiving to-be-processed substrates and retaining such substrates in a desired position and orientation during processing. In one non-limiting exemplary embodiment, the process station 32 can be an ion implant station.

Figure 2:
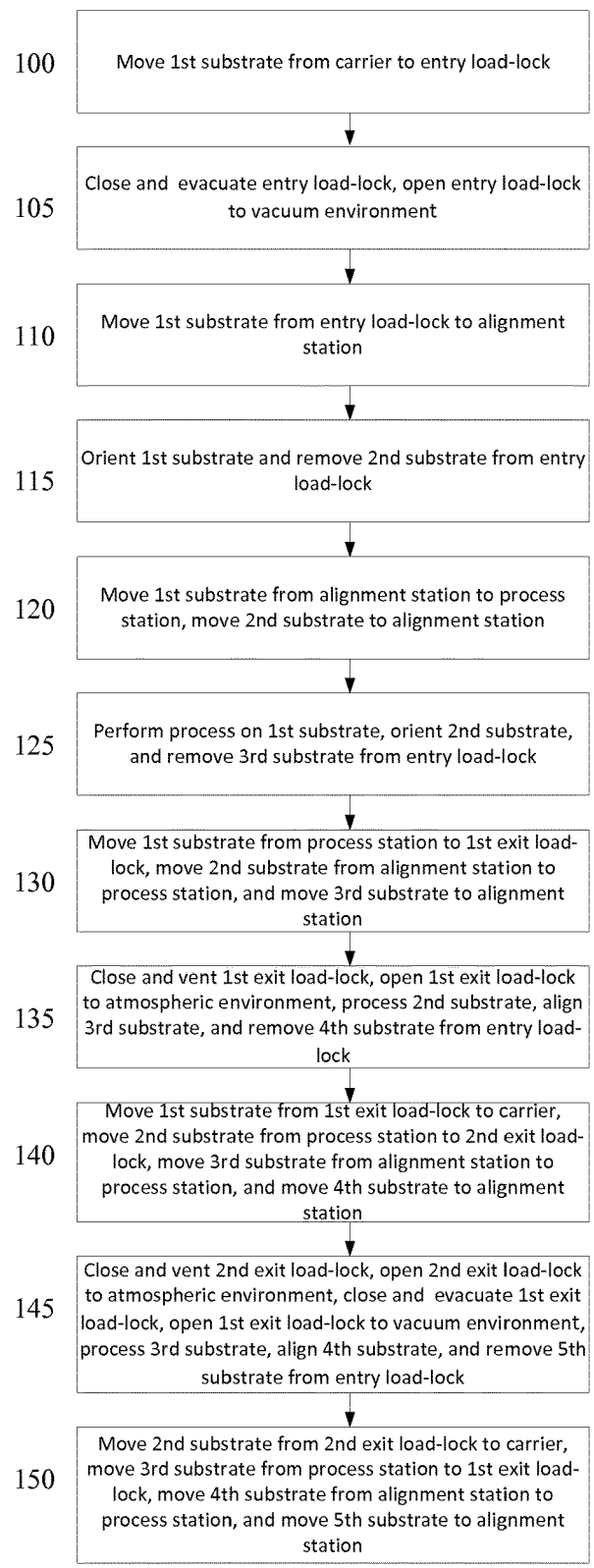
FIG. 2 is a flow diagram illustrating an exemplary substrate processing method in accordance with the present disclosure.

FIG. 2 is a flow diagram illustrating an exemplary method for using the above-described system 10 for handling and processing of substrates in accordance with the present disclosure. The method will be described in detail in conjunction with the FIG. 3, which includes a substrate path diagram indicated by the dashed arrows "A"-"G."

Figure 3:
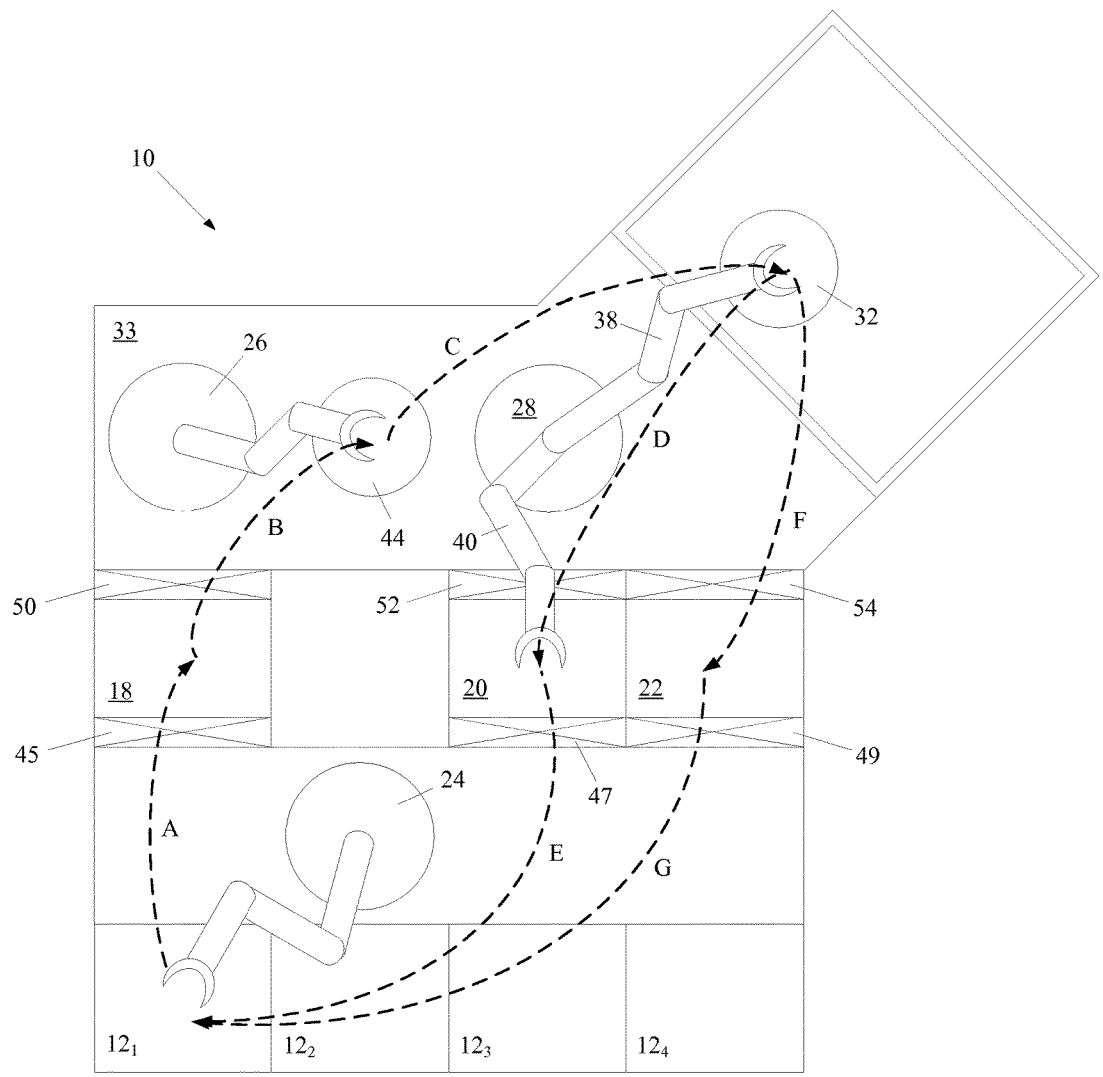
FIG. 3 is a schematic diagram illustrating the exemplary substrate processing system shown in FIG. 1 and further illustrating a substrate path diagram.

At step 100, the atmospheric robot 24 may remove, or "pick," a first substrate from the carrier $12_1$, may move the first substrate along path "A" in FIG. 3, and may place the substrate in the entry load-lock 18. It will be appreciated that instead of picking and moving a single substrate, that the atmospheric robot 24 may pick and move a plurality (e.g., a cassette) of substrates from the carrier $12_1$ to the entry load-lock 18 at once. At step 105, an isolation valve 45 of the entry load-lock 18 may be closed and the interior of the entry load-lock 18 may be evacuated to a vacuum level (100 millitorr, for example) that is compatible with the vacuum environment of the vacuum chamber 33. After evacuation of the entry load-lock 18 is complete, an isolation valve 50 of the entry load-lock 20 may be opened to allow access to the entry load-lock 18 from the vacuum chamber side.

At step 110, the first vacuum robot 26 may pick the first substrate (or a plurality of substrates) from the entry load-lock 18, may move the first substrate along path "B," and may place the first substrate on the alignment station 30. At step 115, the alignment station 30 may automatically detect and adjust the orientation of the first substrate in order to obtain a desired orientation for subsequent processing. If a plurality of substrates was moved to the alignment station 30, the alignment station 30 may sequentially orient each of the substrates. In some embodiments, the first substrate may be provided with a notch or other discrete indicium, such as a fiducial mark, on an edge thereof for facilitating such detection and adjustment. In addition to orienting the first substrate, it is contemplated that the alignment station 30 may additionally inspect and/or identify the first substrate.

While the first substrate is being oriented at the alignment station 30, the first vacuum robot 26 may return to the entry load-lock 18 and may pick a second substrate. Particularly, if a stack of substrates was moved into the entry load-lock 18 in step 100 and made available to the vacuum chamber in step 105, the second substrate may be removed from such stack. Alternatively, if only a single substrate was moved in the entry load-lock 18 in step 100 and made available to the vacuum chamber close in step 105, the second substrate may be moved into the entry load-lock 18 and made available to the vacuum chamber while the first substrate is being moved in step 110.

After the first substrate has been properly oriented in step 115, the first arm 38 of the second vacuum robot 28 may, at step 120, pick the first substrate from the alignment station 30, may move the first substrate along path C and may place the first substrate on the process station 32. As the first substrate is being moved to the process station 32 or shortly thereafter, the first vacuum robot 26 may move the second substrate along path "B" and may place the second substrate on the alignment station 30.

At step 125, the process station 32 may perform a desired process on the first substrate. For example, the process station 32 may be configured to subject the substrate to an ion implantation process whereby the substrate is exposed to an ion beam for a predetermined amount of time. It should be noted, however, that the particular process performed by the process station 32 is not critical, and thus it is contemplated that the system 10 and method described herein may be implemented in conjunction with many different processes for enhancing the efficient throughput of substrates without departing from the scope of the present disclosure.

While the first substrate is being processed at the process station 32, the second substrate may be oriented at the alignment station 30 and the first vacuum robot 26 may return to the entry load-lock 18 and may pick a third substrate.

After completion of the process in step 125, the second arm 40 of the second vacuum robot 28 may, at step 130, pick the first substrate from the process station 32, may move the first substrate along path D, and may place the first substrate in the first exit load-lock 20 which may have been previously evacuated and its isolation valve 52 previously opened. As the first substrate is being moved to the first exit load-lock 20 or shortly thereafter, the first arm 38 of the second vacuum robot 28 may pick the second substrate from the alignment station 30, may move the second substrate along path C, and may place the second substrate on the process station 32, and the first vacuum robot 26 may move the third substrate along path B and may place the third substrate on the alignment station 30.

At step 135, the isolation valve 52 of the first exit load-lock 20 may be closed so that the first exit load-lock can be vented to atmospheric pressure. An isolation valve 47 of the first exit load-lock 20 may then be opened to allow access from the atmospheric side.

While the first exit load-lock 20 is being vented, the second substrate may be processed at the process station 32, the third substrate may be oriented at the alignment station 30, and the first vacuum robot 26 may return to the entry load-lock 18 and may pick a fourth substrate.

At step 140, the atmospheric robot 24 may pick the first substrate from the first exit load-lock 20, may move the first substrate along path E, and may place the first substrate back on the carrier $12_1$ where it may be collected for storage or further processing.

As the first substrate is being moved to the carrier $12_1$ or shortly thereafter, the second arm 40 of the second vacuum robot 28 may pick the second substrate from the process station 32, may move the second substrate along path F, and may place the second substrate in the second exit load-lock 22, which may have been previously evacuated and its isolation valve 54 previously opened. Additionally, the first arm 38 of the second vacuum robot 28 may pick the third substrate from the alignment station 30, may move the third substrate along path C, and may place the third substrate on the process station 32, and the first vacuum robot 26 may move the fourth substrate along path B and may place the fourth substrate on the alignment station 30.

At step 145 of the exemplary method, the isolation valve 54 of the second exit load-lock 22 may be closed and the second exit load-lock 22 may be vented to atmospheric pressure. An isolation valve 49 of the second exit load-lock 22 may then be opened to allow access from the atmospheric side. As the second exit load-lock 22 is vented and opened, the isolation valve 47 of the first exit load-lock 20 may be closed and the first exit load-lock 20 may be evacuated, after which the isolation valve 52 may be opened to allow access to the first exit load-lock 20 from the vacuum chamber 33. Additionally, the third substrate may be processed at the process station 32, the fourth substrate may be oriented at the alignment station 30, and the first vacuum robot 26 may return to the entry load-lock 18 and may pick a fifth substrate.

At step 150 of the exemplary method, the atmospheric robot 24 may pick the second substrate from the second exit load-lock 22, may move the second substrate along path "G," and may place the second substrate on the carrier $12_1$ where it may be collected for storage or further processing.

As the second substrate is being moved to the third carrier $12_1$ or shortly thereafter, the second arm 40 of the second vacuum robot 28 may pick the third substrate from the process station 32, may move the third substrate along path "D," and may place the third substrate in the first exit load-lock 20. Additionally, the first arm 38 of the second vacuum robot 28 may pick the fourth substrate from the alignment station 30, may move the fourth substrate along path "C," and may place the fourth substrate on the process station 32, and the first vacuum robot 26 may move the fifth substrate along path "B" and may place the fifth substrate on the alignment station 30.

The robots 24-28 of the system may continue to work in the above-described fashion to support a continuous movement of substrates through the system 10 until all of the substrates that were originally supplied at carrier $12_1$ have been moved into the system 10, at which point the system 10 may immediately and seamlessly proceed to perform the above-described method on one or more substrates supplied by the carrier $12_2$, then the carrier $12_3$, and so on. It will be appreciated that the order in which substrates are removed from and returned to individual carriers $12_1$, is not critical. It will also be appreciated that the order in which individual carriers $12_{1-n}$ are accessed is likewise not critical. Notably, the first and second exit load-locks 20 and 22 may be alternatively evacuated and vented so that one of the exit load-locks is open to the vacuum chamber 33 for receiving a substrate from the second arm 40 of the second vacuum robot 28 while the other exit load-lock is open to the atmospheric side to allow a substrate to be picked therefrom by the atmospheric robot 24.

Alternative embodiments of the above-described system 10 and corresponding method are contemplated in which the entry load-lock 18 includes two independent entry load-locks. Such a configuration would allow one of the entry load-locks to be available to the atmospheric side for receiving one or more substrates from the atmospheric robot 24 while the other of the entry load-locks is simultaneously available to the vacuum chamber 33 for providing one or more substrates to the first vacuum robot 26. In addition, embodiments of the system 10 are contemplated in which the exit load locks 20, 22 can accept a plurality of substrates at one time for transfer to the atmospheric side of the system. In such cases, the instead of picking and moving a single substrate from the exit load locks 20, 22, the atmospheric robot 24 may pick and move a plurality of substrates from the exit load lock (20 or 22) to the appropriate cassette $12_{1-n}$.

As will be appreciated, the above-described transport scheme does not require direct robot-to-robot transfers of substrates, and thus does not tie up multiple robots with a single substrate at any time. Thus, each robot is only required to perform one pick and one place in order to move a substrate from one station to the next, thereby allowing multiple substrates to be in transit at any given time.

Figure 4:
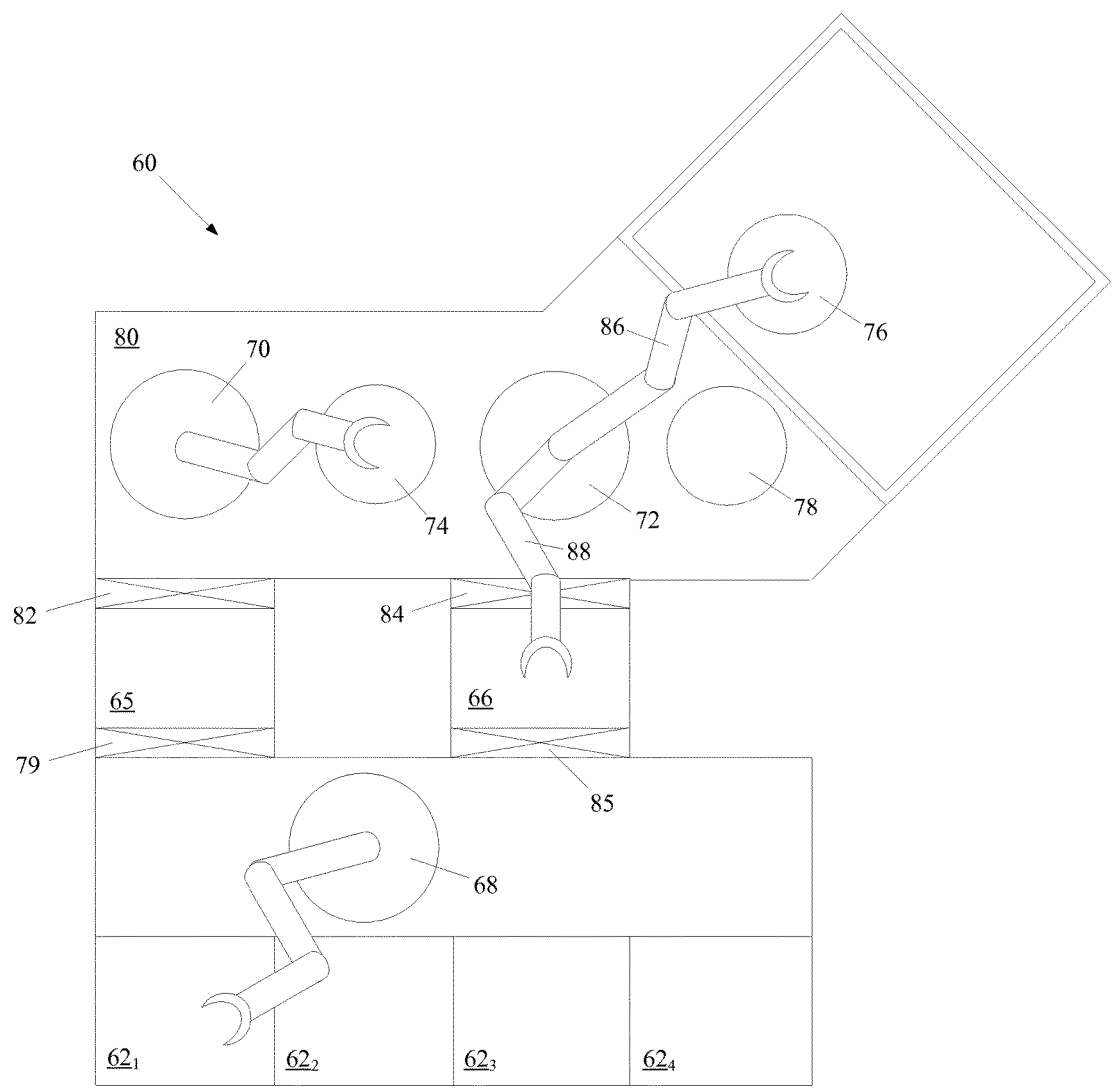
FIG. 4 is a schematic diagram illustrating an exemplary alternative substrate processing system in accordance with the present disclosure.

Referring now to FIG. 4, an exemplary alternative semiconductor substrate processing system 60 (hereinafter "the system 60") in accordance with the present disclosure is shown. The system 60 may be substantially similar to the system 10 described above in that it may include carriers $62_{1-n}$ (which in the non-limiting exemplary embodiment includes four carriers $62_{1-4}$), an entry load-lock 65, and exit load-lock 66, an atmospheric robot 68, first and second vacuum robots 70 and 72, an alignment station 74, and a process station 76. Unlike system 10, however, the system 60 of this embodiment may include only a single exit load-lock 66. In addition, system 60 may include a buffer station 78.

Figure 5:
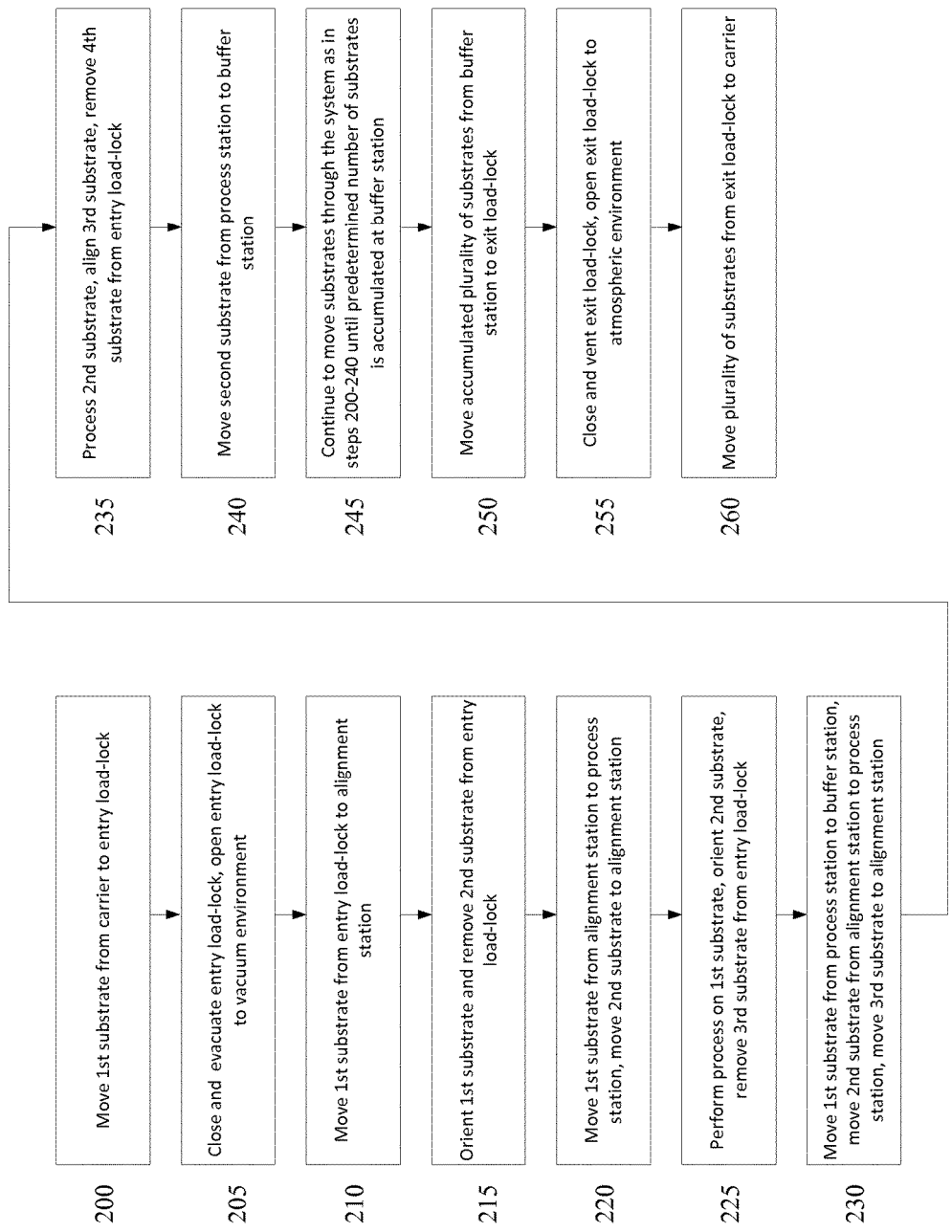
FIG. 5 is a flow diagram illustrating an exemplary alternative substrate processing method in accordance with the present disclosure.

FIG. 5 is a flow diagram illustrating an exemplary method for using the exemplary alternative system 60 to facilitate handling and processing of substrates is shown. The method will be described in detail in conjunction with the representation of the system 60 shown in FIG. 6 which includes a substrate path diagram indicated by the dashed arrows "A"-"F."

Figure 6:
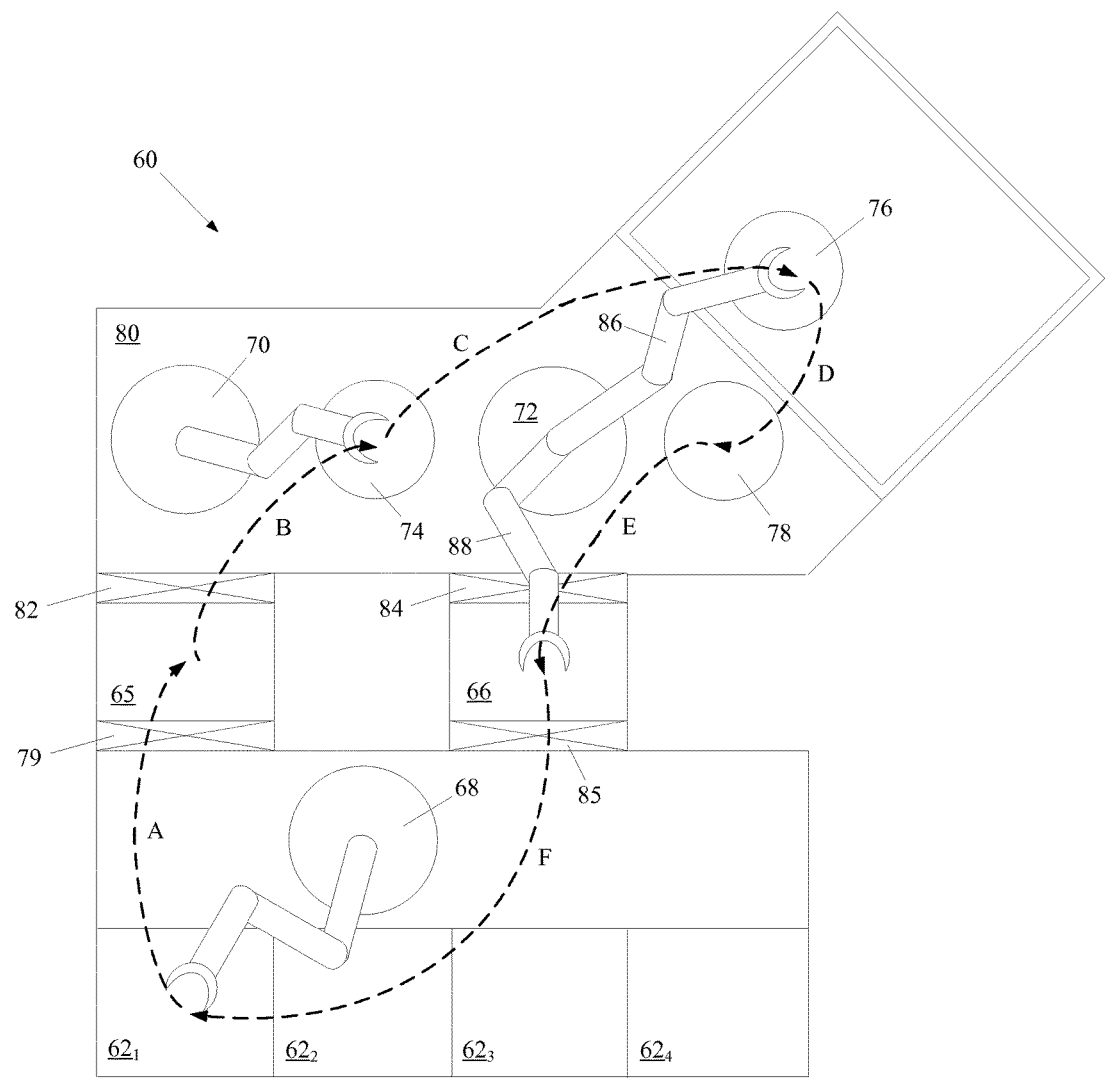
FIG. 6 is a schematic diagram illustrating the exemplary alternative substrate processing system shown in FIG. 4 and further illustrating a substrate path diagram.

At step 200, the atmospheric robot 68 may pick a plurality (e.g., a stack) of substrates from the carrier $62_1$, may move the substrates along path "A" in FIG. 6, and may place the substrates in the entry load-lock 65.

At step 205 of the exemplary method, the entry load-lock 65 may be closed and may be evacuated to a vacuum level compatible with the vacuum chamber 80 (100 millitorr, for example). After evacuation is complete, an isolation valve 82 of the entry load-lock 65 may be opened to allow access to the entry load-lock 65 from the vacuum chamber 80.

At step 210 of the exemplary method, the first vacuum robot 70 may pick the substrates from the entry load-lock 65, may move the first substrate along path "B," and may place the substrates on the alignment station 74.

At step 215, the alignment station 74 may automatically detect and adjust the orientation of each of the substrates in a sequential manner in order to obtain a desired orientation for subsequent processing. Each substrate may be provided with a notch or other indicium on an edge thereof for facilitating such detection and adjustment. In addition to orientating the substrates, it is contemplated that the alignment station 74 may also inspect and/or identify each substrate.

While substrates are being oriented at the alignment station 74, the isolation valve 82 may be closed and the entry load-lock 65 may be pressurized in order to prepare for the introduction of another plurality of substrates.

After a first of the substrates has been oriented in step 215, the first arm 86 of the second vacuum robot 72 may, at step 220, pick the first substrate from the alignment station 74, may move the first substrate along path "C" and may place the first substrate on the process station 76.

At step 225, the process station 76 may perform a process on the first substrate. For example, the process station 76 may be configured to subject the substrate to an ion implantation process whereby the substrate is exposed to an ion beam for a predetermined amount of time. It should be noted, however, that the particular process performed by the process station 76 is not critical, and thus the system 60 and method described herein may be similarly implemented in conjunction with any of a variety of different substrate processes without departing from the scope of the present disclosure.

While the first substrate is being moved to and processed at the process station 76, a second substrate may be oriented at the alignment station 74.

After completion of the process in step 225, the second arm 88 of the second vacuum robot 72 may, at step 230, pick the first substrate from the process station 76, may move the first substrate along path "D," and may deposit the first substrate at the buffer station 78.

As the first substrate is being moved to the buffer station 78 or shortly thereafter, the first arm 86 of the second vacuum robot 72 may pick the second oriented substrate from the alignment station 74, may move the second substrate along path "C," and may place the second substrate on the process station 76.

At step 235 of the exemplary method, the second substrate may be processed at the process station 76 and a third substrate may be oriented at the alignment station 74.

After completion of the process in step 235, the second arm 88 of the second vacuum robot 72 may, at step 240 of the exemplary method, pick the second substrate from the process station 76, may move the second substrate along path "D," and may deposit the second substrate at the buffer station 78.

At step 245 of the exemplary method, the robots 68-72 may continue to move substrates through the system 60 and stack the substrates at the buffer station 78 in the manner described in steps 215-270 above until a stack of a predetermined number of substrates (e.g., 5) is accumulated at the buffer station 78. Once such a predetermined number of substrates have been accumulated, the second vacuum robot 72 may, at step 250, pick the entire stack from the buffer station, may move the stack along path "E," and may place the stack in the exit load-lock 66 which may have been previously evacuated and its isolation valve 84 previously opened.

When all of the substrates have been removed from the alignment station 74, the atmospheric robot 68 may move a new plurality of substrates may from the carrier $62_1$ to the entry load-lock 65, and then from the entry load-lock 65 to the alignment station 74 in the manner described above.

At step 255 of the exemplary method, the isolation valve 84 of the exit load-lock 66 may be closed and the exit load-lock 66 may be vented to atmospheric pressure. An isolation valve 85 of the exit load-lock 66 may then be opened to allow access from the atmospheric side.

At step 260 of the exemplary method, the atmospheric robot 68 may pick the stack of substrates from the exit load-lock 66, may move the stack along path "F," and may place the stack back on the carrier $62_1$ where it may be collected for further processing.

While the exit load-lock 66 is being vented in step 255 and while the stack of substrates is being moved to the carrier $62_1$ in step 260, the robots 68-72 may continue to repeat steps 215-270 of the method to assemble a new stack of substrates at the buffer station 78, after which steps 280-300 of the method may be repeated to move the stack out of the vacuum chamber 80.

Alternative embodiments of the above-described system 60 and corresponding method are contemplated in which the entry load-lock 65 includes two independent entry load-locks. Such a configuration would allow one of the entry load-locks to be available to the atmospheric side for receiving one or more substrates from the atmospheric robot 68 while the other of the entry load-locks is simultaneously available to the vacuum chamber 80 for providing one or more substrates to the first vacuum robot 70. This may allow the system 60 to achieve high throughput while introducing individual substrates into the vacuum chamber 80 in a sequential manner instead of simultaneously introducing a plurality of substrates into the vacuum chamber 80 as described above.

The system 60 and the above-described method thus utilize the buffer station 78 to facilitate a substantially continuous flow of substrates through the system 60, wherein multiple substrates are in transit at any given time, while employing only a single exit load-lock 66. This flow may continue until all of the substrates that were originally supplied at carrier $62_1$ have been moved into the system 60, at which point the system 60 may immediately and seamlessly proceed to perform the above-described method on one or more substrates supplied by the carrier $62_2$, then the carrier $62_3$, and so on. It will be appreciated that the order in which substrates are removed from and returned to individual carriers $62_{1-n}$ is not critical. It will also be appreciated that the order in which individual carriers $62_{1-n}$ are accessed is likewise not critical. It will be appreciated that the system 60 may operate at a somewhat lower efficiency than the system 10 described above because the second arm 88 of the second vacuum robot 72 must perform two picks and places (i.e., between the process station 76 and the buffer station 78 and between the buffer station 78 and the exit load-lock 66) instead of just one.

Figure 7:
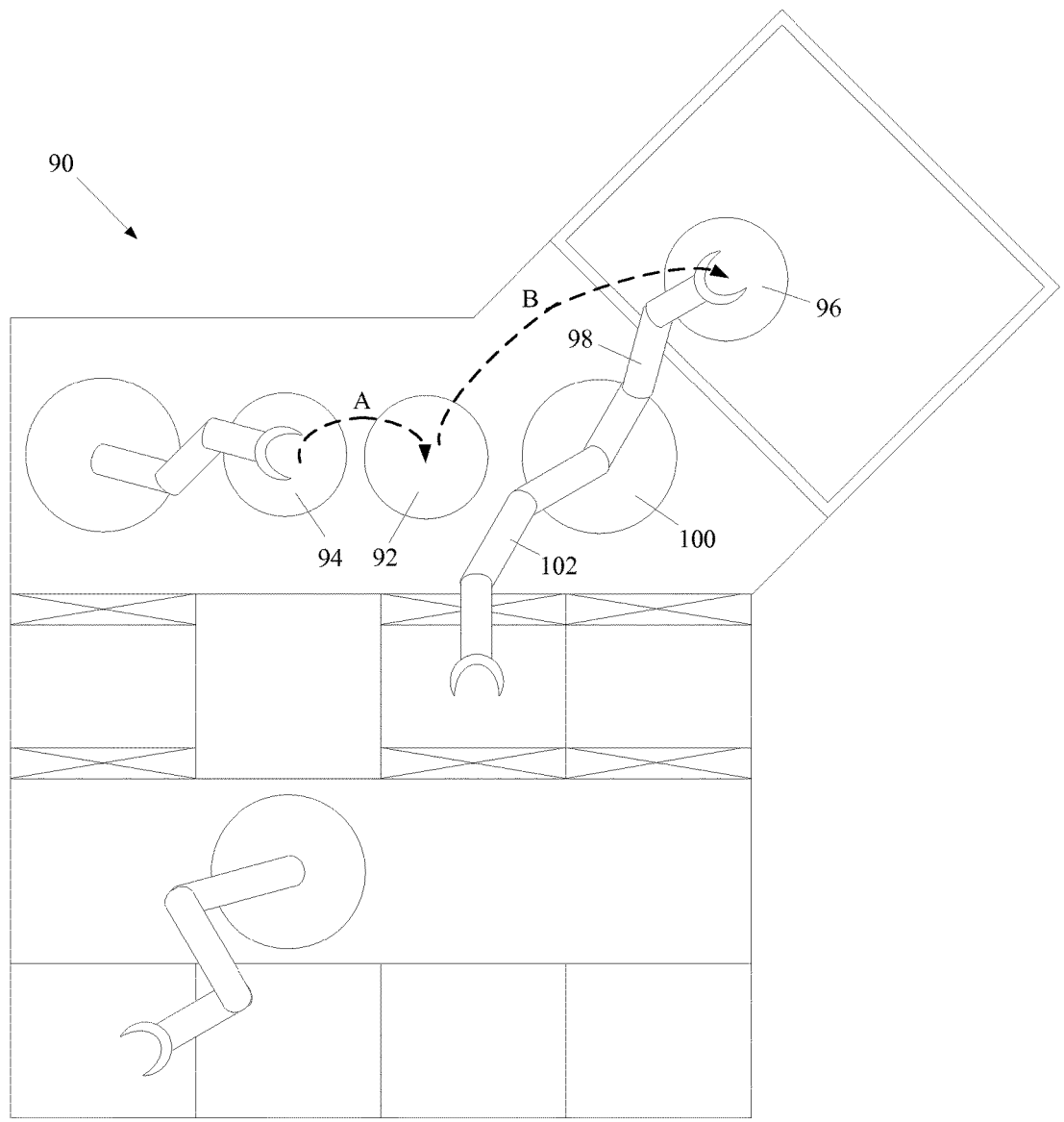
FIG. 7 is a schematic diagram illustrating a further exemplary alternative substrate processing system in accordance with the present disclosure.

Referring now to FIG. 7, another exemplary alternative semiconductor substrate processing system 90 (hereinafter "the system 90") in accordance with the present disclosure is shown. The system 90 may be substantially similar to the system 10 described above, but may further include a preprocess station 92 located between an alignment station 94 and a process station 96. The preprocess station 92 may be provided for heating or cooling a substrate to a desired temperature, or for otherwise preparing a substrate, prior to being processed at the process station 96.

The flow of substrates through the system 90 may be substantially similar to that of the flow of substrates through the system 10 as described above and shown in FIGS. 2 and 3, except that instead of a substrate being moved directly from the alignment station 94 to the process station 96, the first arm 98 of the second vacuum robot 100 may move a substrate from the alignment station 94 to the preprocess station 92 along path "A," and the second arm 102 of the second vacuum robot 100 may subsequently move the substrate from the preprocess station 92 to the process station 96 along path "B." Such a preprocess station 92 and corresponding substrate flow may be similarly implemented in the system 60 described above, for example.

Although alternative systems 60 and 90 and accompanying methods in accordance with the present disclosure have been shown and described herein, it will be understood that such embodiments are provided by way of example only and are not meant to be limiting in any way. Many other variations of the systems 10, 60, and 90 and accompanying methods described above are contemplated and may be implemented without departing from the scope of the present disclosure.

Thus, the present disclosure provides substrate processing systems and methods that facilitate expeditious handling of semiconductor substrates for maximizing throughput of the substrates while employing a minimal number of handling devices. An advantage offered by the systems and methods of the present disclosure is that they provide very high throughput of substrates while implementing a substrate alignment and identification station immediately prior to a process station. Another advantage offered by the systems and methods of the present disclosure is that they employ substrate handling and processing sequences that allow for completely balanced utilization of multiple robots so that each robot performs an identical and minimal number of moves per substrate cycle. A third main advantage offered by the systems and methods of the present disclosure is that they employ two robots that place and retrieve substrates at a process station, wherein such robots are positioned so that a distance traveled to the process station is minimized, thereby maximizing substrate throughput.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The various embodiments or components of the system 10 and method described above may be implemented as part of one or more computer systems. Such a computer system may include a computer, an input device, a display unit and an interface, for example, for accessing the Internet. The computer may include a microprocessor. The microprocessor may be connected to a communication bus. The computer may also include memories. The memories may include Random Access Memory (RAM) and Read Only Memory (ROM). The computer system further may include a storage device, which may be a hard disk drive or a removable storage drive such as a floppy disk drive, optical disk drive, and the like. The storage device may also be other similar means for loading computer programs or other instructions into the computer system.

As used herein, the term "computer" may include any processor-based or microprocessor-based system including systems using microcontrollers, reduced instruction set circuits (RISCs), application specific integrated circuits (ASICs), logic circuits, and any other circuit or processor capable of executing the functions described herein. The above examples are exemplary only, and are thus not intended to limit in any way the definition and/or meaning of the term "computer."

The computer system executes a set of instructions that are stored in one or more storage elements, in order to process input data. The storage elements may also store data or other information as desired or needed. The storage element may be in the form of an information source or a physical memory element within the processing machine.

The set of instructions may include various commands that instruct the computer as a processing machine to perform specific operations such as the methods and processes of the various embodiments of the invention. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the term "software" includes any computer program stored in memory for execution by a computer, such memory including RAM memory, ROM memory, EPROM memory, EEPROM memory, and non-volatile RAM (NVRAM) memory. The above memory types are exemplary only, and are thus not limiting as to the types of memory usable for storage of a computer program.

The invention claimed is:

1. A substrate processing system comprising:
a vacuum chamber;
an entry load-lock coupled to the vacuum chamber, the entry load-lock configured for transferring substrates between an atmospheric environment and the vacuum chamber;
a rotatable alignment station disposed in the vacuum chamber, the alignment station configured to rotatably adjust alignments of said substrates;
a first vacuum robot disposed in the vacuum chamber, the first vacuum robot configured for moving said substrates from the entry load-lock to the alignment station;
a process station disposed in the vacuum chamber;
first and second exit load-locks coupled to the vacuum chamber, the first and second exit load-locks configured for transferring said substrates between the vacuum chamber and the atmospheric environment; and
a second vacuum robot disposed in the vacuum chamber, the second vacuum robot configured to move substrates from the alignment station to the process station and further configured to move substrates from the process station to the first exit load-lock and the second exit load-lock in an alternating fashion;
wherein the first vacuum robot is configured to perform no more than one pick and one place for a substrate or stack of substrates from a time when the substrate or stack of substrates enters the vacuum chamber to a time when the substrate or stack of substrates exits the vacuum chamber.

2. The substrate processing system in accordance with claim 1, further comprising:
a carrier disposed in the atmospheric environment, the carrier for transporting said plurality of substrates; and
an atmospheric robot disposed in the atmospheric environment and configured to move substrates from the carrier to the entry load-lock.

3. The substrate processing system in accordance with claim 2, wherein the atmospheric robot is configured to move substrates from the first exit load-lock to the carrier.

4. The substrate processing system in accordance with claim 1, wherein the second vacuum robot comprises a first arm for moving substrates from the alignment station to the process station and a second arm for moving substrates from the process station to the first exit load-lock and to the second exit load-lock in an alternating fashion.

5. The substrate processing system in accordance with claim 1, wherein the alignment station is configured to identify substrates.

6. A substrate processing system comprising:
an entry load-lock configured to transfer substrates from an atmospheric environment to a vacuum chamber;
a rotatable alignment station disposed in the vacuum chamber and configured to rotatably adjust orientations of substrates;
a first vacuum robot configured to move substrates from the entry load-lock to the alignment station;
a process station disposed in the vacuum chamber and configured to perform a designated process on substrates;
a buffer station configured to hold a plurality of substrates;
an exit load-lock configured to transfer a plurality of substrates from the vacuum chamber to the atmospheric environment; and
a second vacuum robot configured to sequentially move substrates from the alignment station to the process station and from the process station to the buffer station, and further configured to move an accumulated plurality of substrates from the buffer station to the exit load-lock;
wherein the first vacuum robot is configured to perform no more than one pick and one place for a substrate or stack of substrates from a time when the substrate or stack of substrates enters the vacuum chamber to a time when the substrate or stack of substrates exits the vacuum chamber.

7. The substrate processing system in accordance with claim 6, further comprising:
a carrier disposed in the atmospheric environment, the carrier for carrying said plurality of substrates; and
an atmospheric robot disposed in the atmospheric environment and configured to move substrates from the carrier to the entry load-lock.

8. The substrate processing system in accordance with claim 7, wherein the atmospheric robot is configured to move substrates from the first exit load-lock to the carrier.

9. The substrate processing system in accordance with claim 6, wherein the second vacuum robot comprises:
a first arm for sequentially moving substrates from the alignment station to the process station; and
a second arm for sequentially moving substrates from the process station to the buffer station and for moving an accumulated plurality of substrates from the buffer station to the exit load-lock.

10. The substrate processing system in accordance with claim 6, wherein the alignment station is further configured to identify substrates.

* * * * *